(12) United States Patent
Podell et al.

(10) Patent No.: US 10,680,573 B1
(45) Date of Patent: Jun. 9, 2020

(54) TRANSMISSION-LINE-BASED IMPEDANCE TRANSFORMER WITH COUPLED SECTIONS HAVING A COMMON SIGNAL CONDUCTOR

(71) Applicant: Werlatone, Inc., Brewster, NY (US)

(72) Inventors: Allen F. Podell, Palo Alto, CA (US); Ky-Hien Do, Carp (CA); Mariama Dadhi Barrie, Brewster, NY (US)

(73) Assignee: Werlatone, Inc., Patterson, NY (US)

( * ) Notice: Subject to any disclaimer, the term of this patent is extended or adjusted under 35 U.S.C. 154(b) by 0 days.

(21) Appl. No.: 16/703,732

(22) Filed: Dec. 4, 2019

Related U.S. Application Data

(62) Division of application No. 16/452,410, filed on Jun. 25, 2019, now Pat. No. 10,536,128.

(51) Int. Cl.
| | |
|---|---|
| *H03H 7/38* | (2006.01) |
| *H01P 3/06* | (2006.01) |
| *H01P 5/12* | (2006.01) |

(52) U.S. Cl.
CPC ............ *H03H 7/38* (2013.01); *H01P 3/06* (2013.01); *H01P 5/12* (2013.01)

(58) Field of Classification Search
CPC .............. H03H 7/38; H01P 3/06; H01P 5/12
See application file for complete search history.

(56) References Cited

U.S. PATENT DOCUMENTS

| | | |
|---|---|---|
| 2,115,826 A | 5/1938 | Norton et al. |
| 4,305,043 A | 12/1981 | Ho et al. |
| 4,394,630 A | 7/1983 | Kenyon et al. |
| 5,159,298 A | 10/1992 | Dydyk |
| 5,352,994 A | 10/1994 | Black et al. |
| 5,697,088 A | 12/1997 | Gu |

(Continued)

FOREIGN PATENT DOCUMENTS

| | | |
|---|---|---|
| CN | 201749928 U | 2/2011 |
| JP | H07226609 A | 8/1995 |
| JP | 10126117 A | 5/1998 |

OTHER PUBLICATIONS

Cristal, Edward, Coupled-Transmission-Line Directional Couplers With Coupled Lines of Unequal Characteristic Impedances, Stanford Research Institute, published Aug. 1966, Menlo Park, California, 6 pages.

(Continued)

*Primary Examiner* — Samuel S Outten
(74) *Attorney, Agent, or Firm* — Kolisch Hartwell, P.C.

(57) ABSTRACT

A transmission-line-based impedance transformer including first and second couplers, with each coupler including respective pairs of coupled signal conductors. The signal conductors are connected sequentially in series between an input port and an output port and may form a single spiral configuration. A signal conductor of one coupler may be connected in series between the two signal conductors of another coupler. The couplers have characteristic impedances between an input impedance and an output impedance. A signal conductor of a coupler may include first and second conductor portions disposed in respective spaced-apart parallel planes, with the other signal conductor of the coupler disposed physically directly between the conductor portions. A signal conductor in the spiral may be shielded from coupled signal conductors by ground conductors disposed in respective spaced-apart parallel planes on opposite sides of the shielded signal conductor. The first and second couplers may have a shared signal conductor.

12 Claims, 10 Drawing Sheets

(56) References Cited

U.S. PATENT DOCUMENTS

| | | |
|---|---|---|
| 6,472,950 B1 | 10/2002 | London |
| 6,737,932 B2 | 5/2004 | Killen et al. |
| 6,753,745 B2 | 6/2004 | Killen et al. |
| 6,819,200 B2 | 11/2004 | Zhao et al. |
| 6,822,532 B2 | 11/2004 | Kane et al. |
| 6,972,639 B2 | 12/2005 | Podell |
| 6,972,640 B2 | 12/2005 | Nagamori et al. |
| 7,042,309 B2 | 5/2006 | Podell |
| 7,138,887 B2 | 11/2006 | Podell |
| 7,245,192 B2 | 7/2007 | Podell |
| 7,821,354 B2 | 10/2010 | Niiranen |
| 8,058,947 B2 | 11/2011 | Moll |
| 8,174,338 B2 | 5/2012 | Dowling |
| 8,248,181 B2 | 8/2012 | Podell |
| 8,988,161 B2 | 3/2015 | Campbell |
| 9,537,198 B2 | 1/2017 | Seneviratne et al. |
| 9,966,646 B1 | 5/2018 | Podell |
| 2011/0309894 A1 | 12/2011 | Kuo et al. |
| 2012/0229230 A1 | 9/2012 | Mei et al. |
| 2014/0118071 A1 | 5/2014 | Mei et al. |
| 2019/0115875 A1* | 4/2019 | Nikolayenkov ........ H03F 3/189 |

OTHER PUBLICATIONS

Trask, Chris, A Tutorial on Transmission Line Transformers, Sonoran Radio Research, Expanded and Revised Aug. 14, 2005, 7 pages.

Ahn, Hee-Ran, et al., Transmission-Line Directional Couplers for Impedance Transforming, Microwave and Wireless Components Letters, IEEE, published Oct. 10, 2006, vol. 16, No. 10, 3 pages.

Jensen, Thomas, et al., Coupled Transmission Lines as Impedance Transformer, Transactions on Microwave Theory and Techniques, IEEE, published 2007, 55(12), 2957-2965, 10 pages.

Xiang, Z. et al., "Design of Broadband Impedance Transformer Using Coupled Microstrip Transmission Lines," IEEE International Symposium on Microwave, Antenna, Propagation and EMC Technologies for Wireless Communications, Oct. 27-29, 2009, pp. 994-997.

Zhurbenko, Vitaliy, et al., Impedance Transformers, Passive Microwave Components and Antennas, IEEE, published Apr. 1, 2010, chapter 14, 303-322, 22 pages.

Wincza, Krzysztof, et al., Asymmetric Coupled-Line Directional Couplers as Impedance Transformers in Balanced and n-Way Power Amplifiers, Transactions on Microwave Theory and Techniques, IEEE, published Jul. 7, 2011, vol. 59, No. 7, 8 pages.

Ranzani, Leonardo, A 4 : 1 Transmission-Line Impedance Transformer for Broadband Superconducting Circuits, Transactions on Applied Superconductivity, IEEE, Oct. 2012, vol. 22, No. 5., 6 pages.

Wang, Xin-Huai, et al., A Tri-band Impedance Transformer Using Stubbed Coupling Line, Progress in Electromagnetics Research, published Jul. 9, 2013, 33-45, vol. 141, School of Technical Physics, Xidian University, Xi'an, Shaanxi, 13 pages.

* cited by examiner

TRANSMISSION-LINE-BASED IMPEDANCE TRANSFORMER WITH COUPLED SECTIONS HAVING A COMMON SIGNAL CONDUCTOR

RELATED APPLICATION

This is a division of application Ser. No. 16/452,410, filed Jun. 25, 2019, which application is incorporated herein by reference in its entirety for all purposes.

FIELD

This disclosure relates to impedance transformers. More specifically, the disclosed embodiments relate to broadband transmission-line-based impedance transformers.

INTRODUCTION

For certain applications, there is a need for a broadband, high power communication system. For example, in military applications a broad bandwidth is required for secure spread spectrum communication and high power is required for long range. High power broadband communication systems require high power broadband antennas. Often these antennas have an input impedance that does not match the desired transmitter or receiver with which it is used. In such circumstances, impedance transformers can be used to transform the impedance of the antenna to the impedance of the transmitter or receiver.

Transmission-line-based impedance transformers may be used for matching networks for antennas and amplifiers operating at radio frequencies, such as frequencies in the HF and VHF bands. They are also known for having low losses, which makes them especially useful in high power circuits. Transmission-line-based impedance transformers may be made using various structures, such as parallel wires, coaxial cables, or twisted wire pairs.

SUMMARY

The present disclosure provides impedance transformers having wide bandwidth. In some embodiments, an impedance transformer may include first and second couplers. The first coupler includes first and second transmission lines. The first transmission line includes a first signal conductor and the second transmission line includes a second signal conductor. The first and second transmission lines each have a respective physical length corresponding to an odd-numbered multiple of a quarter of wavelength of a design frequency. The first and second signal conductors are electromagnetically closely coupled.

The second coupler includes third and fourth transmission lines. The third transmission line includes a third signal conductor and the second transmission line includes a fourth signal conductor. The third and fourth transmission lines each have a respective physical length corresponding to an odd-numbered multiple of the quarter of the wavelength of the design frequency. The third and fourth signal conductors are electromagnetically closely coupled.

The first, third, second, and fourth signal conductors are connected sequentially in series between an input port configured to be connected to a first external circuit having an input impedance and an output port configured to be connected to a second external circuit having the output impedance. The third signal conductor is connected in series between the first signal conductor and the second signal conductor. The first coupler has a first characteristic impedance between the input impedance and the output impedance, and the second coupler has a second characteristic impedance between the first characteristic impedance and the output impedance.

In some embodiments, an impedance transformer includes a first coupler including first and second transmission lines. The first transmission line includes a first signal conductor and the second transmission line includes a second signal conductor. The first and second transmission lines each have a respective physical length corresponding to an odd-numbered multiple of a quarter of a wavelength of a design frequency. The first and second signal conductors are connected sequentially in series between an input port configured to be connected to a first external circuit having an input impedance and an output port configured to be connected to a second external circuit having the output impedance. The first coupler has a first characteristic impedance between the input impedance and the output impedance. The second signal conductor includes first and second conductor portions and the first signal conductor is disposed physically between and is electromagnetically closely coupled to the first and second conductor portions.

In some embodiments, an impedance transformer includes a plurality of transmission lines including first, second, and third transmission lines. Each transmission line has an electrical length corresponding to an odd-numbered multiple of a quarter of a wavelength of a design frequency. The plurality of transmission lines are connected to each other electrically in series between an input port of a first external circuit having an input impedance at the input port and an output port of a second external circuit having the output impedance at the output port. Each of the plurality of transmission lines has a respective signal conductor. A first signal conductor of the first transmission line and a second signal conductor of the second transmission line are electromagnetically closely coupled and form a first coupler having a first characteristic impedance between the input impedance and the output impedance. The second signal conductor and a third signal conductor of the third transmission line are electromagnetically closely coupled and form a second coupler having a second characteristic impedance between the input impedance and the output impedance.

Features, functions, and advantages may be achieved independently in various embodiments of the present disclosure, or may be combined in yet other embodiments, further details of which can be seen with reference to the following description and drawings.

DESCRIPTION

Overview

Figure 1:
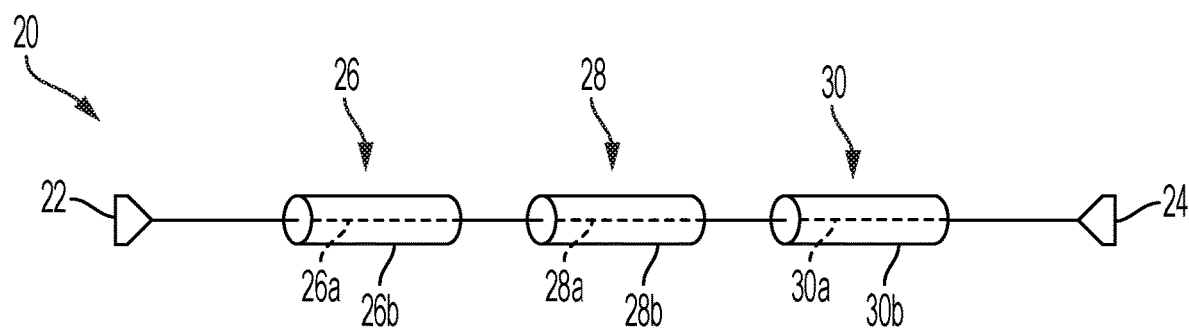
FIG. 1 is an illustration of a schematic diagram of a conventional three-section transmission-line impedance transformer.

Various embodiments of a transmission-line-based impedance transformer having coupled sections are described below and illustrated in the associated drawings. Unless otherwise specified, a transmission-line-based impedance transformer and/or its various components may, but are not required to, contain at least one of the structure, components, functionality, and/or variations described, illustrated, and/or incorporated herein. Furthermore, the structures, components, functionalities, and/or variations described, illustrated, and/or incorporated herein in connection with the present teachings may, but are not required to, be included in other embodiments. The following description of various embodiments is merely exemplary in nature and is in no way intended to limit the disclosed inventions, their applications, or uses. Additionally, the advantages provided by the embodiments, as described below, are illustrative in nature and not all embodiments provide the same advantages or the same degree of advantages.

Generally, a transmission-line-based impedance transformer as illustrated by the various embodiments discussed below may include a pair of coupled transmission-line sections, such as first and second transmission lines, forming a coupler. The first transmission line may include a first signal conductor having a first end configured to be connected to an input port of a first external circuit having an input impedance at the input port. The first signal conductor preferably has an electrical length corresponding to an odd-numbered multiple of a quarter of a wavelength of a design frequency and a first impedance between the input impedance and an output impedance that is different than the input impedance. Similarly, the second transmission line may include a second signal conductor having a first end and a second end, wherein the second end is configured to be connected to an output port of a second external circuit having the output impedance at the output port. The second signal conductor preferably has an electrical length corresponding to an odd-numbered multiple of the quarter of the wavelength of the design frequency and a second impedance between the first impedance and the output impedance. The first and second signal conductors are connected electrically in series between the input port and the output port and are electromagnetically closely coupled.

As will be seen, additional sections of transmission lines connected in series between the input port and the output port may be included. Such additional transmission lines may be between the input port and the first transmission line, between the first and second transmission lines, and/or between the second transmission line and the output port. Also, the input impedance may be higher or lower than the output impedance.

Definitions

"Node" refers to a point on an electrical circuit where a characteristic of the circuit may be identified. A port or a terminal is considered a node of a circuit structure that provides external access or connection, or represents an end of a circuit component or structure.

Two elements are considered "coupled" when they are in such relation that the performance of one element influences the performance of the other by energy transfer by electrical conduction (involving electron flow), electromagnetic induction (such as inductive coupling or capacitive coupling), or electromagnetic radiation. Coupling includes being connected, either permanently or releasably, whether directly or indirectly through intervening components, and is not necessarily limited to physical connection(s). Electromagnetically coupled elements have energy transfer by electromagnetic induction, such as is provided by inductive coupling or capacitive coupling.

Two spaced-apart conductive lines are inductively coupled or electromagnetically coupled when they are spaced closely enough together for energy flowing in one to be induced in the other electromagnetically and/or electrostatically. The amount of energy flowing between the lines is related to the dielectric and magnetic media the conductors are in and the spacing between the lines. Even though electromagnetic fields surrounding the lines are theoretically infinite, lines are often referred to as being closely or tightly coupled, loosely coupled, or uncoupled, based on the relative amount of coupling. The amount of coupling may be defined by a coupling coefficient. However, as a practical measure, two lines may be considered to be inductively coupled when a detectable signal is coupled from one line onto the other. A threshold of coupling may be appropriate to distinguish between coupled and uncoupled lines. In most applications, two lines that have less than 20 dB inductive coupling between them are considered to be uncoupled lines. In some applications, lines that have less than 100 dB are considered to be uncoupled lines. In terms of a coupling coefficient, two lines may be considered to be electromagnetically closely coupled if the coupling coefficient is greater than 0.1. For purposes of the following description, two lines, including inductors that are electromagnetically closely coupled are also referred to as a coupler. Thus, two lines may be considered as loosely coupled or substantially uncoupled if they have a coupling coefficient of less than 0.1.

Two conductors are electrically connected when there is an electron current path between them, including any conductors and electron-conductive electrical elements, such as resistors, and inductors, but not coupling by either electromagnetic induction such as inductive coupling or capacitive coupling, or electromagnetic radiation, such as radio waves and microwave power transmission. Two conductors or other components may be directly electrically connected when there are no intervening electrical elements. Electrical components connected in series conduct the same current. Electrical elements connected in parallel have the same voltage across them.

Ordinal terms such as "first", "second", and "third" are used to distinguish or identify various members of a group, or the like, in the order they are introduced in a particular context and are not intended to show serial or numerical limitation, or be fixed identifiers for the group members.

Where "a" or "a first" element or the equivalent thereof is recited, such usage includes one or more such elements, neither requiring nor excluding two or more such elements.

EXAMPLES

The following sections describe selected aspects of exemplary transmission-line-based impedance transformers as well as related systems and/or methods. The examples in these sections are intended for illustration and should not be interpreted as limiting the entire scope of the present disclosure. Each section may include one or more distinct inventions, and/or contextual or related information, function, and/or structure.

Example 1

Referring initially to FIG. 1, the basic structure of a conventional transmission-line impedance transformer 20 that transforms an input impedance ZIN on an input port 22 to a different output impedance ZOUT on an output port 24. ZIN may be smaller or larger than ZOUT. For example, impedance transformer 20 may convert a 50-ohm input impedance ZIN to a 25-ohm output impedance ZOUT.

Although any suitable number of transmission-line sections may be used, in this example, impedance transformer 20 includes three transmission-line sections, 26, 28, 30, shown as coaxial transmission lines, connected physically and electrically in series between input port 22 and output port 24. Each transmission-line section has a respective signal conductor 26a, 28a, 30a and a corresponding signal-return or ground conductor 26b, 28b, 30b. The transmission-line sections, and the corresponding signal conductors in this example, each have an electrical length equal to one-quarter of a wavelength ($\lambda/4$) of a center or design operating frequency of the circuit. Although not shown, the respective signal-return or shield conductors are connected to a circuit ground.

Transmission-line sections 26, 28, 30 have respective characteristic impedances Z1, Z2, and Z3 that are between the input impedance and the output impedance in value. The impedances vary progressively in value from a value closest to the input impedance on transmission-line section 26 connected to the input port to a value closest to the output impedance on transmission-line section 30 connected to the output port. For ZIN>ZOUT, the transmission-line section impedances are selected so that ZIN>Z1>Z2>Z3>ZOUT. Each quarter-wavelength section transforms impedance between the input impedance of the section Z(input) to the output impedance of the section Z(output) if the impedance of the section Z(section) has a value that satisfies the equation, $Z(section)^2=Z(input) \times Z(output)$. For a center design frequency of 638 MHz, with ZIN=50 ohms and ZOUT=25 ohms, then transmission-line section impedances may be Z1=42.1 ohms, Z2=35.35 ohms, and Z3=29.7 ohms.

Figure 2:
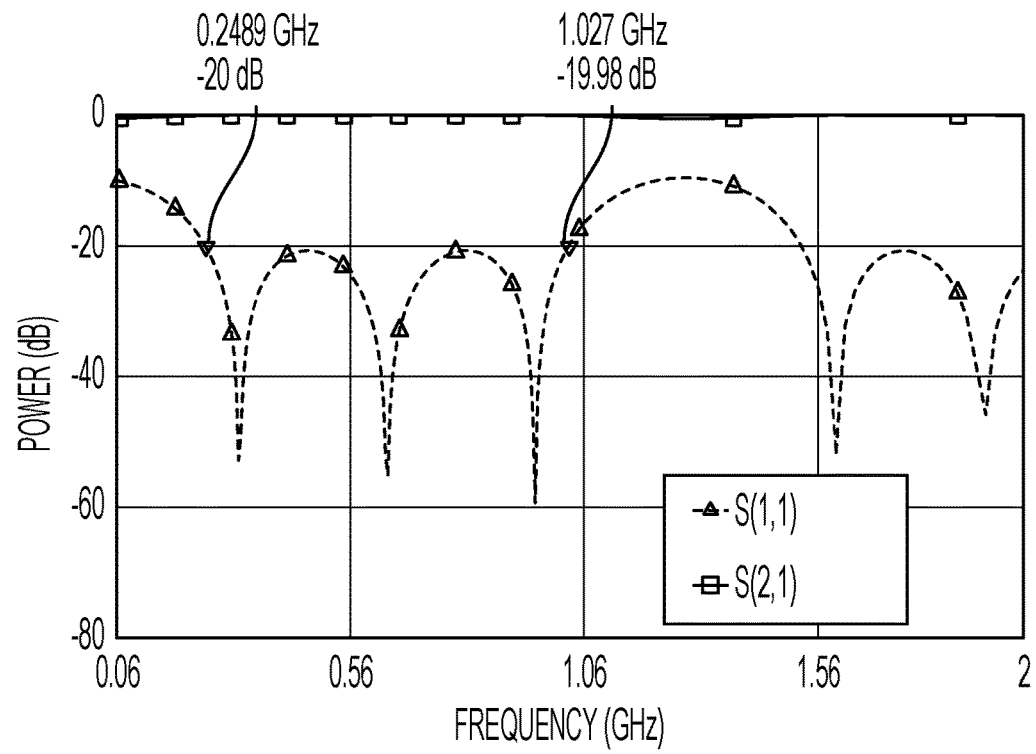
FIG. 2 is a chart illustrating a typical frequency response of an impedance transformer illustrated in FIG. 1.

FIG. 2 illustrates a frequency response of this example of transmission-line impedance transformer 20 over a frequency range of 0.06-2 GHz. It is seen that the return loss, S(1,1), is below about −20 dB between 0.2489 GHz and 1.027 GHz and insertion loss, S(2, 1), is correspondingly very close to 0 dB over this bandwidth.

Example 2

Figure 3:
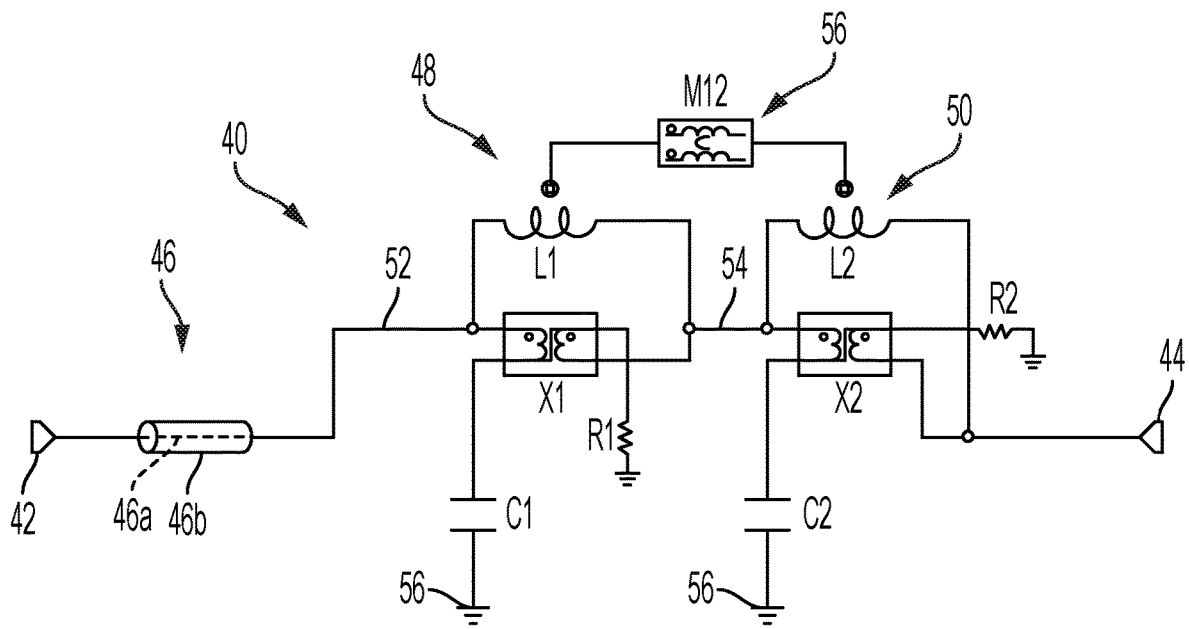
FIG. 3 is a schematic diagram of an example of a three-section transmission-line-based impedance transformer having two coupled sections.

Referring to FIG. 3, an example of a modified three-section transmission-line-based impedance transformer is shown generally at 40. Transmission-line-based impedance transformer 40 transforms an input impedance ZIN on an input port 42 to a different output impedance ZOUT on an output port 44. Impedance transformer 40 includes three transmission-line sections 46, 48, 50 connected physically and electrically in series between input port 42 and output port 44. Transmission-line section 46 and an associated signal conductor 46a, have physical lengths equal to one-quarter of a wavelength ($\lambda/4$) of a center or design operating frequency of the circuit. However, transmission-line section lengths may generally be any odd number of quarter wavelengths ($N\lambda/4$, N=1, 3, 5, . . . ) long.

Transmission-line section 46 is shown as a coaxial transmission line having a signal conductor 46a and a signal-return or ground conductor 46b. Transmission-line sections 48, 50 are lumped-element equivalent circuits of transmission lines. Transmission-line section 48 has a signal line 52 that connects to a signal line 54 of transmission-line section 50 through a parallel combination of a series inductor L1 (62.90 nH in this example) and a preferably 1:1 transformer X1. A shunt capacitor C1 (49.45 pF) connects a primary winding of transformer X1 to a circuit ground 56 (the signal-return line). The non-inverting terminal of a secondary winding of transformer X1 is terminated (connected to circuit ground) by a terminating resistor R1. The inverting terminal of the secondary winding of transformer X1 is connected to signal line 54. Transformer X1 inverts the signal on signal line 52, thereby providing modulation of the signal passing through inductor L1.

Transmission-line section 50 has a signal line 54 that connects to output port 44 through a parallel combination of a series inductor L2 (5.20 nH) and a preferably 1:1 transformer X2. A shunt capacitor C2 (5.64 pF) connects a primary winding of transformer X2 to circuit ground 56. The non-inverting terminal of a secondary winding of transformer X2 is terminated (connected to circuit ground) by a terminating resistor R2. The inverting terminal of the secondary winding of transformer X2 is connected to output port 44. Transformer X2 inverts the signal on signal line 54, thereby providing modulation of the signal passing through inductor L2.

Inductors L1 and L2 are electromagnetically closely coupled. This coupling is represented in the circuit of FIG. 3 by mutual inductance M12 (5.1 nH) between the inductors L1, L2. The extent of mutual coupling is set by a coefficient of coupling k dependent on the portion of the total flux lines that passes through the windings of both inductors. Equivalent transmission-line sections 48, 50 thereby form in combination a coupler 56.

Transmission-line section 46 and coupler 56 have respective characteristic impedances Z1 and ZC that are between the input impedance and the output impedance in value. The impedances preferably vary progressively in value from a value closest to the input impedance on transmission-line section 46 connected to the input port to a value closest to the output impedance on coupler 56 connected to the output port. This progression of values of impedance may vary, but the respective impedances are selected to provide well-matched transformation of the impedances between the input port and the output port.

As with transmission-line impedance transformer 20, transmission-line section 46, 48, 50 preferably have respective individual characteristic impedances Z1, Z2, and Z3 that are between the input impedance and the output impedance in value. The impedances may vary progressively in value from a value closest to the input impedance on transmission-line section 46 connected to the input port to a value closest to the output impedance on transmission-line section 50 connected to the output port. For ZIN>ZOUT, the individual transmission-line section impedances may be selected so that ZIN>Z1>Z2>Z3>ZOUT. For a center design frequency of 638 MHz, ZIN=50 ohms, and ZOUT=25 ohms, then the transmission-line section impedances may be Z1=42.1 ohms, Z2=35.35 ohms, and Z3=29.7 ohms.

Figure 4:
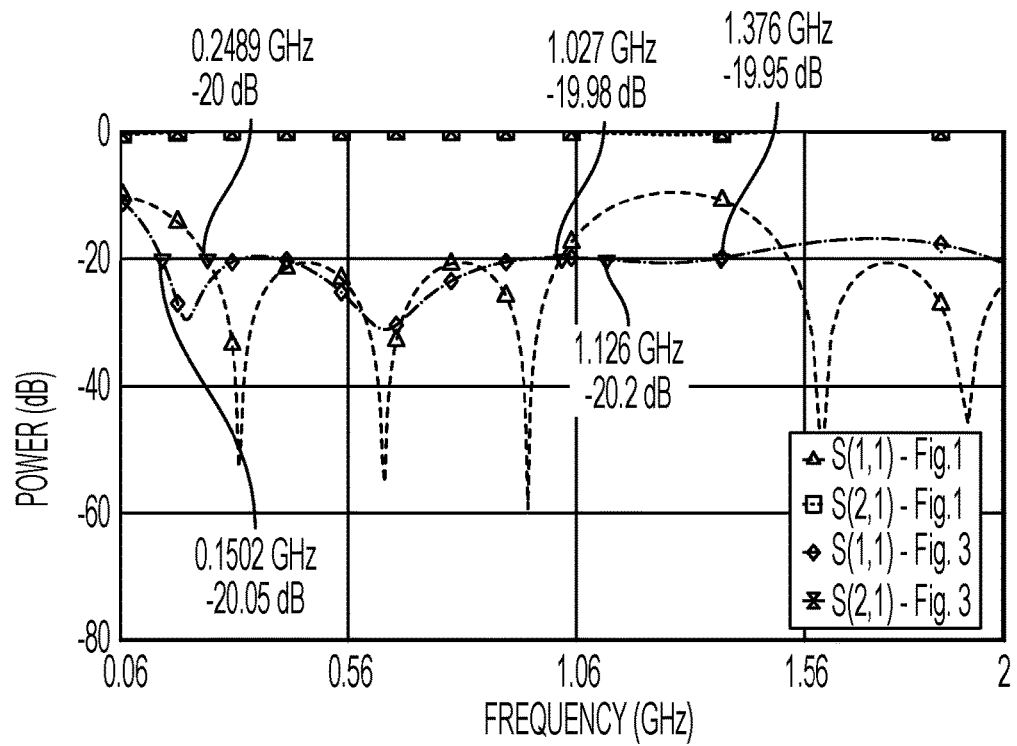
FIG. 4 is a chart illustrating comparative frequency responses of the impedance transformer of FIG. 1 and the impedance transformer of FIG. 3.

FIG. 4 illustrates a frequency response of this example of transmission-line-based impedance transformer 40 over a frequency range of 0.06-2 GHz compared to the frequency response of transmission-line impedance transformer 20. It is seen that the return loss, S(1,1), for transmission-line-based impedance transformer 40 is below about −20 dB between 0.1502 GHz and 1.376 GHz and insertion loss, S(2,1), is correspondingly very close to 0 dB over this bandwidth. Transmission-line-based impedance transformer 40 is thus seen to have a broader bandwidth than transmission-line impedance transformer 20.

Example 3

Figure 5:
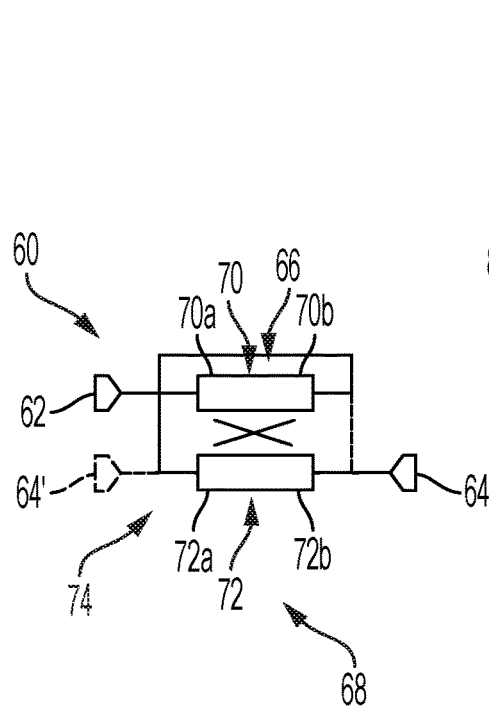
FIG. 5 is a simplified schematic diagram of an example of a two-section transmission-line-based impedance transformer in which the two sections are coupled.

This example is an illustrative transmission-line-based impedance transformer having coupled transmission-line sections, as shown generally at 60 in FIG. 5. Transmission-line-based impedance transformer 60 transforms an input impedance ZIN on an input port 62 to a different output impedance ZOUT on an output port 64. ZIN may be smaller or larger than ZOUT. Although any suitable number of transmission-line sections may be used, in this example, impedance transformer 60 includes two transmission-line sections, 66, 68, connected physically and electrically in series between input port 62 and output port 64. As will be seen with reference to FIGS. 3, 6, 8-11, and 13, transmission-line-based impedance transformer 60 may include one or more series-connected transmission-line sections before transmission-line section 66, between transmission-line sections 66, 68, or after transmission-line section 68.

Transmission-line sections 66, 68 have respective signal conductors 70, 72, with ground 56, not shown, being the signal-return conductor. An input end 70a of signal conductor 70 is connected directly or indirectly to input port 62. An output end 70b of signal conductor 70 is connected directly or indirectly to an input end 72a of signal conductor 72. An output end 72b of signal conductor 72 is connected directly or indirectly to output port 64. The transmission-line sections, and the corresponding signal conductors in this example, each have an electrical length equal to one-quarter of a wavelength (λ/4) of a center or design operating frequency of the circuit. Transmission-line sections 66, 68 are electromagnetically closely coupled and form a coupler 74.

With signal conductors 70, 72 connected as shown in solid lines and as is described above, the current flows in signal conductor 70 in the same direction as it flows in signal conductor 72, i.e., from left to right as shown in the figure. Signal conductors 70, 72 may also be connected as shown by the dashed lines so that current flows through signal conductors 70, 72 in opposite directions. That is, conductor end 70b may be connected to conductor end 72b, and conductor end 72a is connected to the output port, shown as output port 64'. Coupling between signal conductors 70 and 72 is found to be increased significantly when configured so that current flows in the coupled signal conductors in the same direction, as represented by the solid lines in FIG. 5.

Transmission-line sections 66, 68 may have respective characteristic impedances Z1 and Z2 that are between the input impedance ZIN and the output impedance ZOUT in value. The impedances preferably vary progressively in value from a value closest to the input impedance on transmission-line section 66 connected to the input port to a value closest to the output impedance on transmission-line section 68 connected to the output port. The combination of individual transmission-line impedances Z1, Z2 may be chosen the produce a characteristic impedance ZC of coupler 74 that transforms the impedance between ZIN and ZOUT. For ZIN>ZOUT, the individual transmission-line section impedances may be selected so that ZIN>Z1>Z2>ZOUT. As has been discussed, impedances of the transmission-line sections are selected so that each quarter-wavelength section transforms impedance between the input impedance of the section to the output impedance of the section.

Example 4

Figure 6:
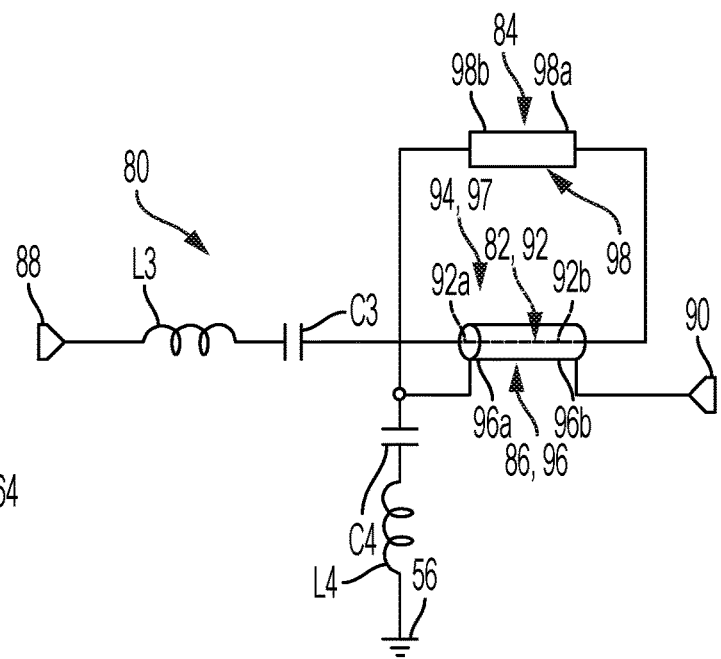
FIG. 6 is a schematic diagram of another example of a three-section transmission-line-based impedance transformer having two coupled sections.

FIG. 6 illustrates another illustrative example of a transmission-line-based impedance transformer 80 having three transmission-line sections 82, 84, 86 connected in series between an input port 88 and an output port 90. These transmission-line sections each preferably have an electrical length equal to one-quarter of a wavelength (λ/4) (or an odd number of quarter wavelengths) of a center or design operating frequency of the circuit. Transmission-line sections 82 and 86 are electromagnetically closely coupled. In transmission-line-based impedance transformer 40 described with reference to FIG. 3, serially adjacent transmission-line sections 48, 50 are closely coupled. In this example, transmission-line section 82 includes a center signal conductor 92 of a coaxial transmission line 94. Transmission-line section 86 includes as a signal conductor the outer or shield conductor 96 of coaxial transmission line 94. The coaxial transmission line in this example, then, is configured as a coupler 97.

A difference between transmission-line-based impedance transformer 80 and transmission-line-based impedance transformer 40, then, is that serially spaced-apart transmission-line sections 82, 86 are closely coupled. Transmission-line section 84, which is serially between transmission-line sections 82, 86, is not closely coupled to either of transmission-line sections 82 and 86.

Transmission-line-based impedance transformer 80 further includes an inductor L3 (1.02 nH in this example) and a capacitor C3 (89.1 pF) connected in series between input port 88 and transmission-line section 82. Capacitor C3 is connected to an end 92a of center conductor 92. The other end 92b of center conductor 92 is connected to an end 98a of a signal conductor 98 of transmission-line section 84. An end 98b of signal conductor 98 is connected to an end 96a of shield conductor 96. End 96a is also connected to ground 56 by a series connection of a capacitor C4 (17.21 pF in this example) and an inductor L4 (0.3 nH). Capacitor C4 adds capacitance to ground for center conductor 92, and inductor L4 is shown to model the inductive effects of the coaxial capacitance. An end 96b of signal conductor 96 is connected directly to output port 90.

Transmission-line section 84 and coaxial transmission line 94 (coupler 97) including transmission-line sections 82, 86, have respective characteristic impedances Z1 and ZC that are between the input impedance ZIN and the output impedance ZOUT in value. As has been discussed, impedances of the transmission-line sections are selected so that each quarter-wavelength section transforms impedance between the input impedance of the section to the output impedance of the section. In this example, the characteristic impedance ZC of coaxial transmission line 94 is 40.66 ohms, and characteristic impedance Z1 of transmission-line section 82 is preferably also a value intermediate between the input and output impedances.

Figure 7:
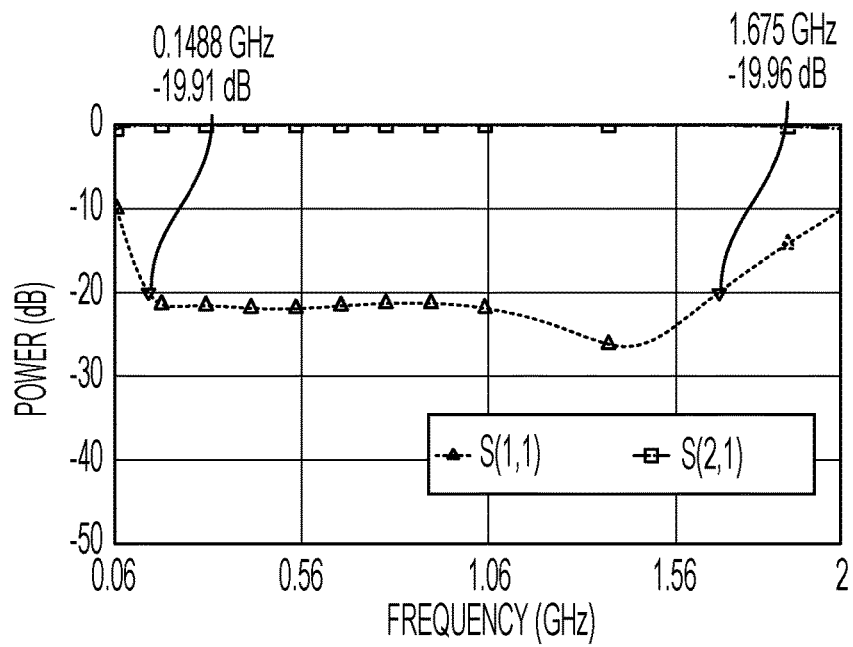
FIG. 7 is a chart showing the frequency response of the impedance transformer of FIG. 6.

FIG. 7 illustrates a frequency response of transmission-line-based impedance transformer 80 over a frequency range of 0.06-2 GHz. It is seen that the return loss, S(1,1), for transmission-line-based impedance transformer 80 is below about −20 dB between 0.1488 GHz and 1.675 GHz and insertion loss, S(2,1), is correspondingly very close to 0 dB over this bandwidth. Transmission-line-based impedance transformer 80 is thus seen to have a broader bandwidth than transmission-line-based impedance transformer 40.

Example 5

Figure 8:
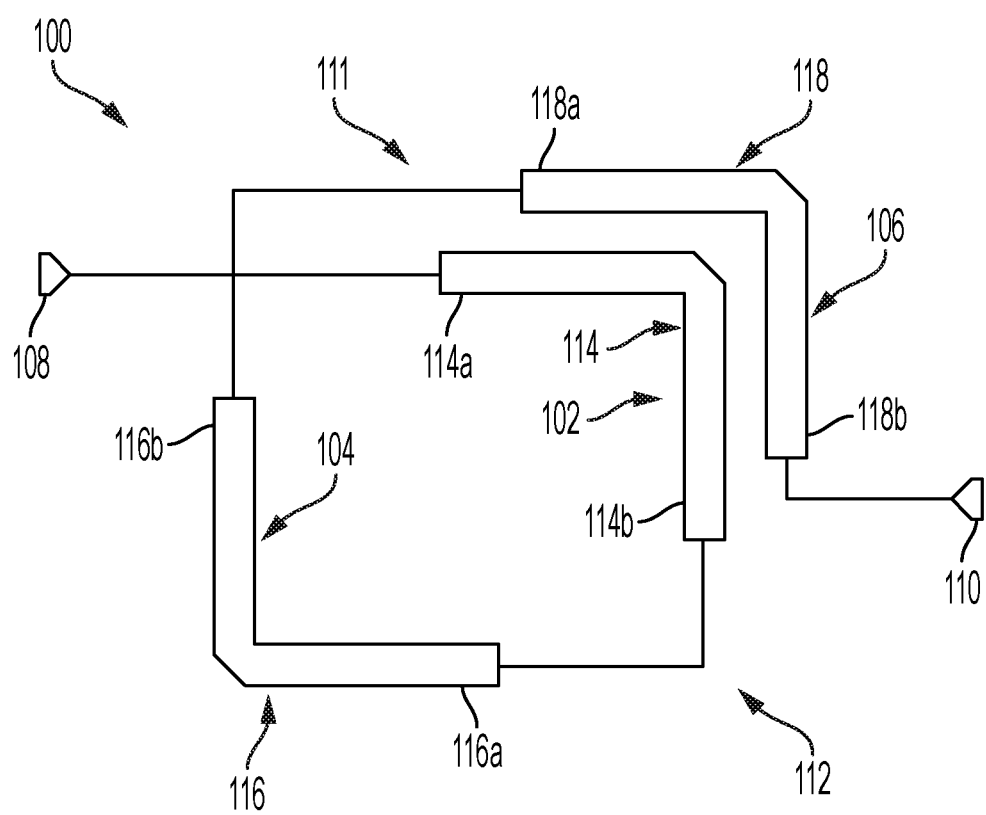
FIG. 8 is a simplified schematic diagram of an example of a spiral three-section transmission-line-based impedance transformer having two coupled sections.

This example, as shown in FIG. 8, is a simplified illustrative transmission-line-based impedance transformer 100 having three transmission-line sections 102, 104, 106 in a spiral configuration connected in series between an input port 108 and an output port 110. These transmission-line sections each preferably have an electrical length equal to one-quarter of a wavelength (λ/4) (or an odd number of quarter wavelengths) of a center or design operating frequency of the circuit. Serially spaced-apart transmission-line sections 102 and 106 are electromagnetically closely coupled and form a coupler 111. In this example, transmission-line sections 102 and 106 are adjacent or side-by-side portions of a spiral 112. Transmission-line section 104, which is serially between transmission-line sections 102, 106, is not closely coupled to either of transmission-line sections 102 and 106. Transmission-line sections 102, 104, 106 have respective signal conductors 114, 116, 118 that each extend around a half of a loop of spiral 112, producing in combination a 1.5-turn or loop spiral with signal conductor 116 opposite in the spiral from signal conductors 114, 118.

A first end 114a of signal conductor 114 is connected to input port 108. A second end 114b of signal conductor 114 is connected to a first end 116a of signal conductor 116. A second end 116b of signal conductor 116 is connected to a first end 118a of signal conductor 118. A second end 118b of signal conductor 118 is connected to output port 110.

Transmission-line section 104 and coupler 111 including transmission-line sections 102, 106, have respective characteristic impedances Z1 and ZC that are between the input impedance ZIN and the output impedance ZOUT in value. For ZIN>ZOUT, the transmission-line section and coupler characteristic impedances are selected to transform ZIN to ZOUT.

Example 6

Figure 9:
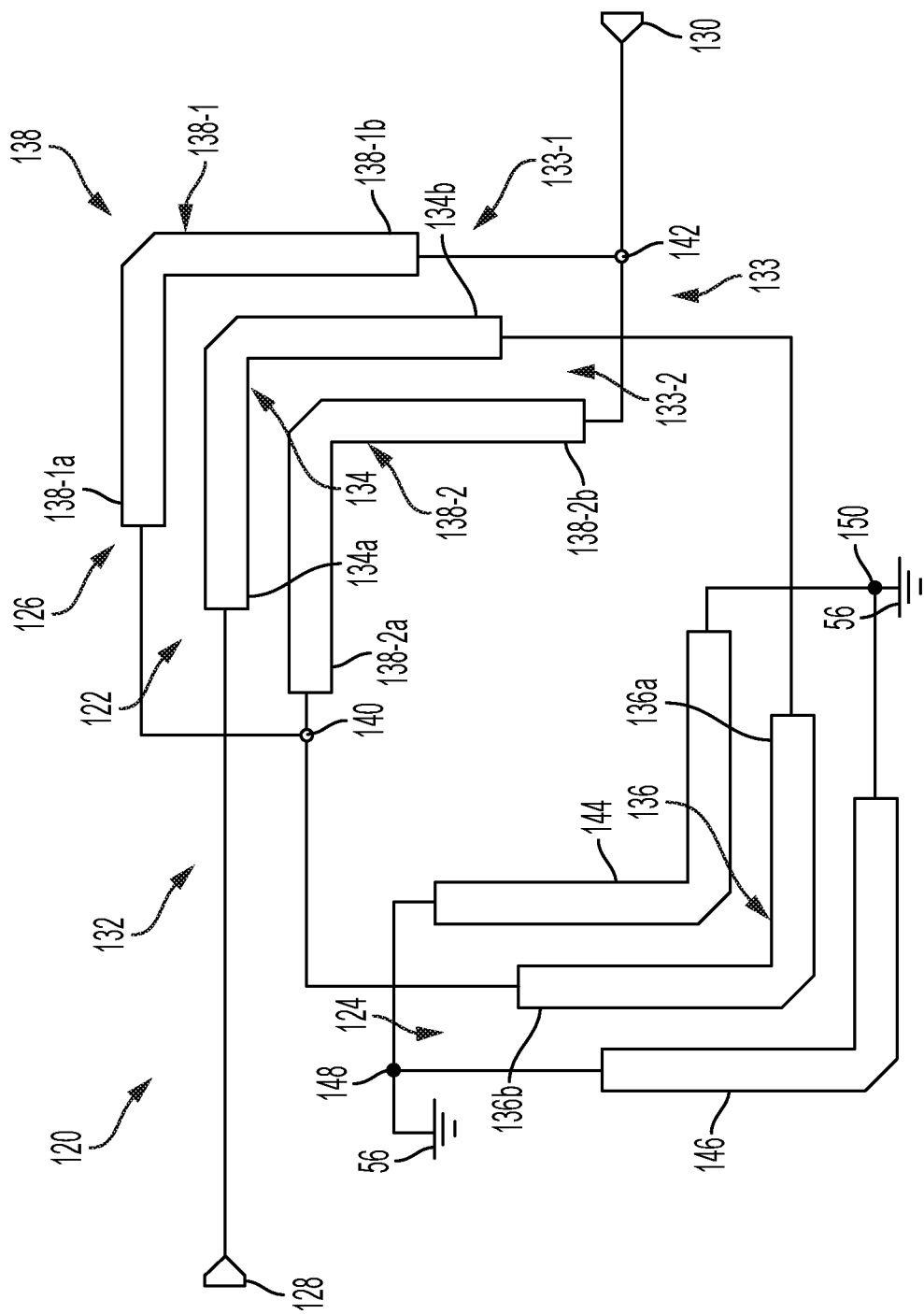
FIG. 9 is simplified schematic diagram of yet another example of a spiral three-section transmission-line-based impedance transformer having two coupled sections.

An example of transmission-line-based impedance transformer 100 is illustrated as a transmission-line-based impedance transformer 120 shown generally in FIG. 9. Transmission-line-based impedance transformer 120 has three transmission-line sections 122, 124, 126 connected in series between an input port 128 and an output port 130 in a spiral 132. These transmission-line sections each preferably have an electrical length equal to one-quarter of a wavelength (λ/4) (or an odd number of quarter wavelengths) of a center or design operating frequency of the circuit. Serially spaced-apart transmission-line sections 122 and 126 are electromagnetically closely coupled and form a coupler 133. In this example, transmission-line sections 122 and 126 are adjacent or side-by-side portions of spiral 132. Transmission-line section 124, which is serially between transmission-line sections 122, 126, is not closely coupled to either of transmission-line sections 122 and 126 and forms the other half of the spiral configuration.

It is thus seen that impedance transformer 120 is similar in general configuration to impedance transformer 100. Transmission-line sections 122, 124, 126 have respective signal conductors 134, 136, 138 that each extend around a half of a loop of spiral 132, producing in combination a 1.5-turn or loop spiral. A first end 134a of signal conductor 134 is connected to input port 128. A second end 134b of signal conductor 134 is connected to a first end 136a of signal conductor 136.

Signal conductor 138 is formed of two conductor portions 138-1, 138-2. Ends 138-1a, 138-2a of respective conductor portions 138-1, 138-2 are connected together at a node 140. Similarly, opposite ends 138-1b, 138-2b of respective conductor portions 138-1, 138-2 are also connected together at a node 142. Conductor portions 138-1, 138-2 are accordingly connected electrically in parallel, since they extend between the same two nodes where they are connected together. Also, conductor portions 138-1, 138-2 are physically disposed on opposite sides of signal conductor 134 and signal conductor 134 is closely coupled to both of conductor portions 138-1, 138-2. Coupler 133 accordingly includes a coupler portion 133-1 formed by signal conductor 134 and signal conductor portion 138-1, and a coupler portion 133-2 formed by signal conductor 134 and signal conductor portion 138-2. A second end 136b of signal conductor 136 is connected to node 140 and node 142 is connected to output port 130.

Transmission-line section 124 and coupler 133 have respective characteristic impedances Z1 and ZC, as was described for transmission-line-based impedance transformer 100.

Impedance transformer 120 also includes at least a first ground conductor 144 that is connected to but separate from general circuit ground 56, wherein first ground conductor 144 extends along and is closely coupled to signal conductor 136. In some examples, impedance transformer 120 also includes a second ground conductor 146 that is also connected to but separate from general circuit ground 56, and that extends along and is also closely coupled to signal conductor 136. First and second ground conductors 144, 146 preferably have the same length as signal conductor 136 and the same profile when viewed normal to the plane of signal conductor 136. Ground conductors 144, 146 also are connected to ground as shown by their connections at opposite ends to respective circuit nodes 148, 150, which nodes are in turn connect to circuit ground 56. The ground conductors 144, 146 are also preferably physically disposed on opposite sides of signal conductor 136 to shield signal conductor 136 at least partially from the coupling between signal conductors 134 and 138.

Example 7

Figure 10:
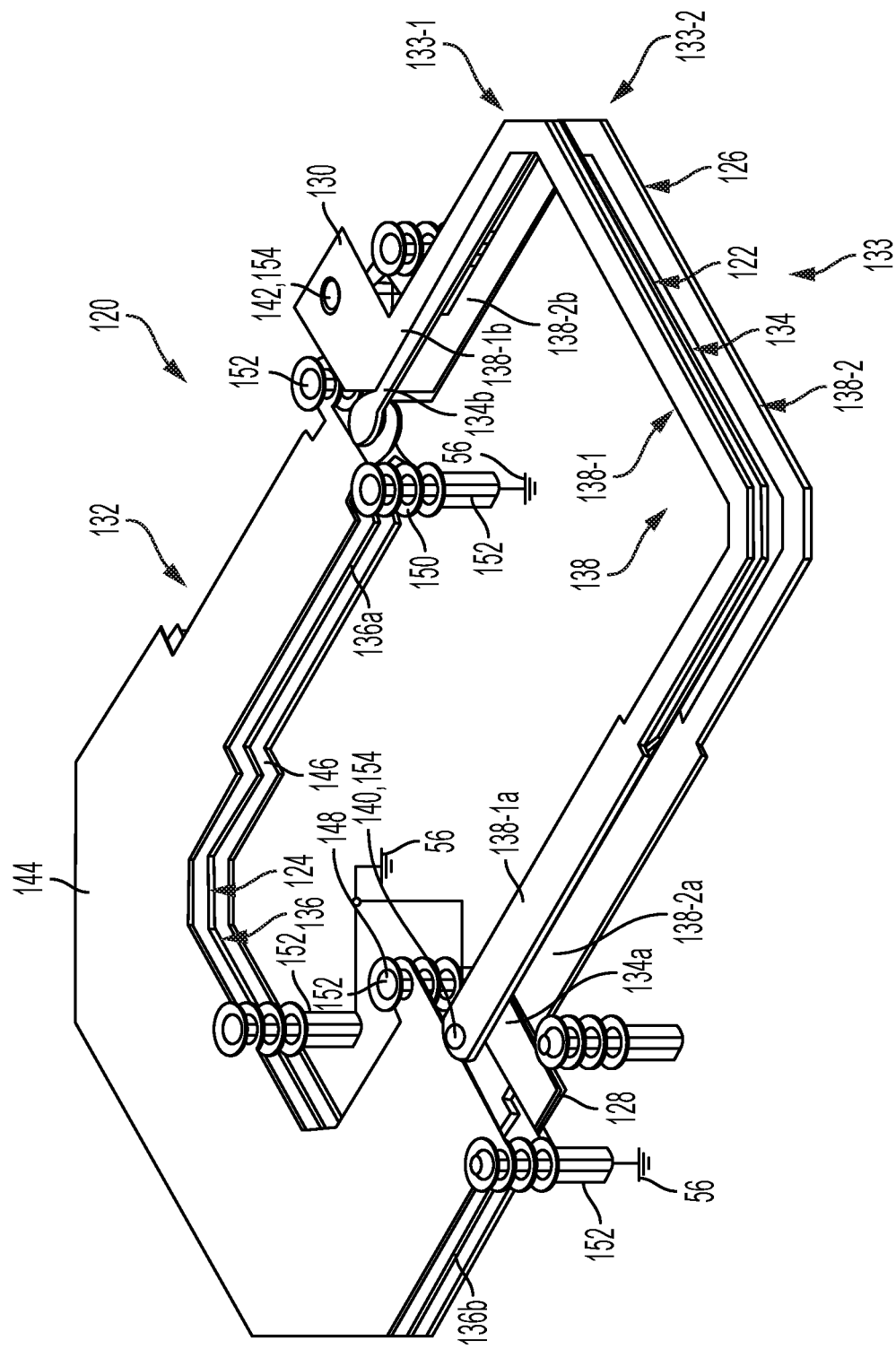
FIG. 10 is an isometric view of conductive layers of an example of a planar configuration of the impedance transformer of FIG. 9.

FIG. 10 illustrates a planar embodiment of transmission-line-based impedance transformer 120. To facilitate the explanation of FIG. 10, like parts are assigned the same reference numbers as shown in FIG. 9. Accordingly, the general description of impedance transformer 120 with respect to FIG. 9 also applies to the planar embodiment shown in FIG. 10.

It is seen that each quarter-wavelength transmission-line section extends around half of spiral 132. Signal conductors 134 and 138 have comparatively narrow traces having similar profiles that overlap when viewed in a plane of one of the signal conductors or conductor portions, providing broadside coupling between them. Signal conductor 134 is sandwiched between conductor portions 138-1, 138-2 so that signal conductor 134 is broadside coupled to conductor portions 138-1, 138-2, forming thereby, coupler 133 having coupler portions 133-1, 133-2.

On the other hand, transmission-line section 136 is not closely coupled to another transmission-line section and in fact is shielded substantially by ground conductors 144, 146, all of which have relatively wide traces compared to transmission-line sections 134, 138-1, 138-2. Ground conductors 144, 146 have the same profile as transmission-line section 136, when viewed normal to the plane of transmission-line section 136. Transmission-line section 136 is accordingly broadside coupled to ground conductors 144, 146, with the broad traces providing increased capacitance to ground over the length of the transmission-line section.

Ground conductors 144, 146 are connected to a ground plane providing circuit ground 56, not shown, by various ground vias 152 that also form ground nodes 148, 150 illustrated in FIG. 9. Also, conductor-portion ends 138-1$a$, 138-2$a$ and conductor-portion ends 138-1$b$, 138-2$b$ of conductor portions 138-1, 138-2 are respectively connected together at nodes 140, 142, by associated interconnection vias 154.

Example 8

Figure 11:
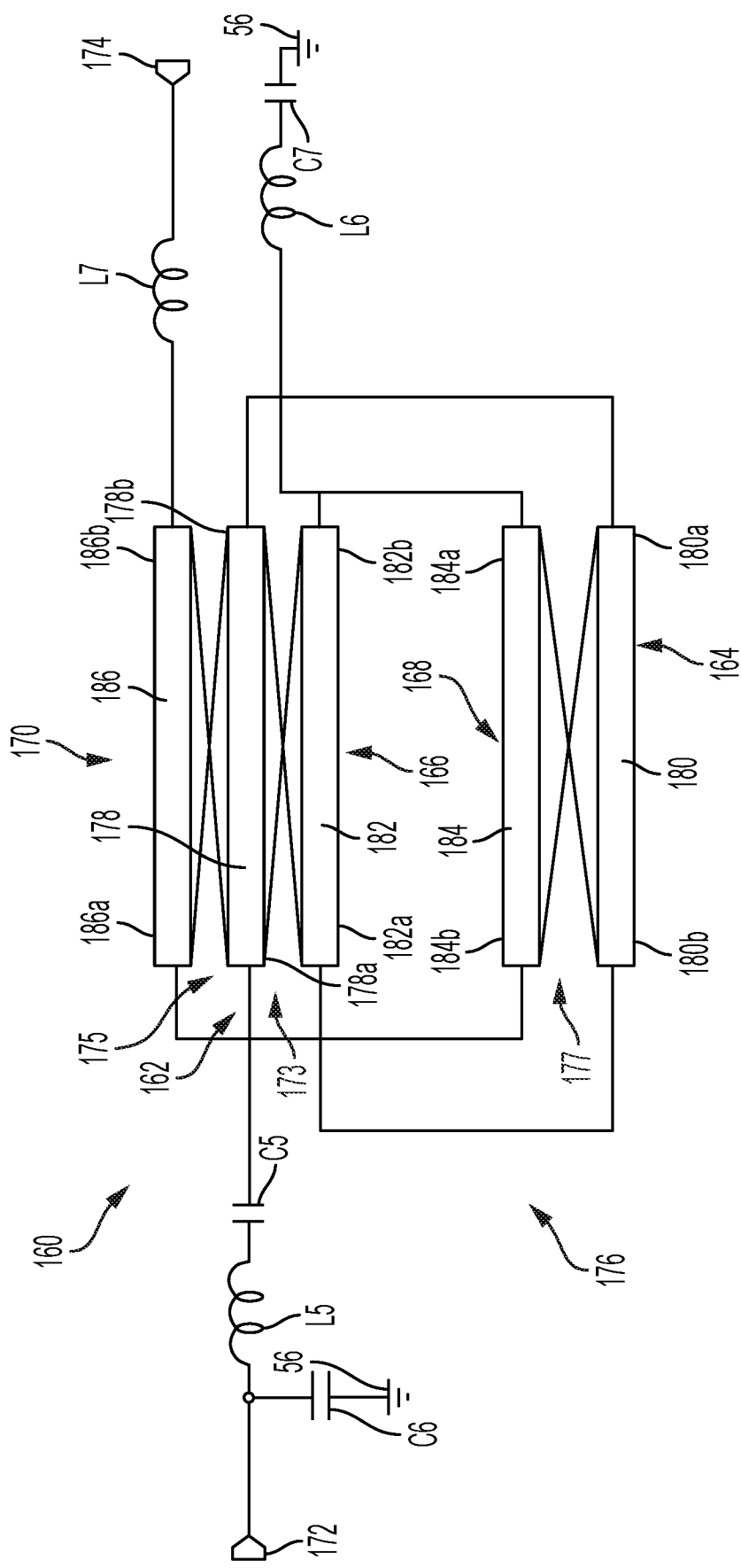
FIG. 11 is a simplified schematic diagram of an example of a multi-turn spiral five-section transmission-line-based impedance transformer having three coupled sections and another two coupled sections.
Figure 12:
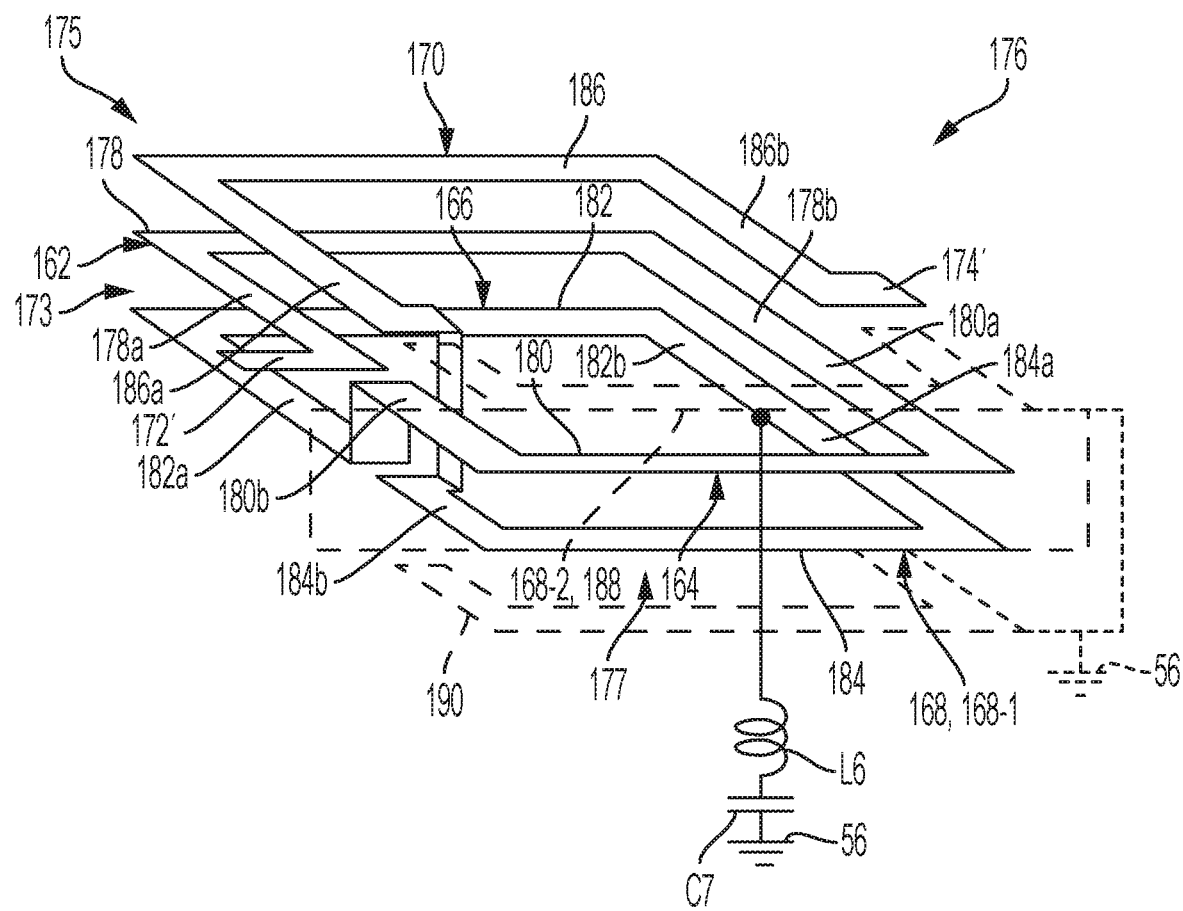
FIG. 12 is a simplified isometric view of conductive layers of an example of the impedance transformer of FIG. 11.

A circuit schematic suitable for modeling a planar embodiment of a further example of a transmission-line-based impedance transformer 160 is shown in FIG. 11. In this example, transmission-line-based impedance transformer 160 has five transmission-line sections 162, 164, 166, 168, 170, in a spiral configuration connected in series between an input port 172 and an output port 174. These transmission-line sections each preferably have an electrical length equal to one-quarter of a wavelength ($\lambda$/4) (or an odd number of quarter wavelengths) of a center or design operating frequency of the circuit. Serially spaced-apart transmission-line sections 162, 166, 170 are electromagnetically closely coupled. Transmission-line sections 162, 166 form a first coupler 173, and transmission-line sections 166, 170 form a second coupler 175. In this example, transmission-line sections 162, 166, 170 are adjacent or side-by-side portions of a spiral 176. Remaining serially spaced-apart transmission-line sections 164, 168 are also electromagnetically closely coupled with each other and form the remaining portion of spiral 176 opposite to the spiral portion formed by transmission-line sections 162, 166, 170. Transmission-line sections 164, 168 correspondingly form a third coupler 177. An expanded and simplified isometric view of an example of spiral 176 is illustrated in FIG. 12. In FIG. 12, an input node 172' of the spiral is connected indirectly with input port 172 and an output node 174' of the spiral is connected indirectly to output port 174.

Transmission-line sections 162, 164, 166, 168, 170 have respective signal conductors 178, 180, 182, 184, 186 that each extend around a half of a loop of spiral 176, producing in combination a 2.5-turn or loop spiral. A first end 178$a$ of signal conductor 178 is connected to input port 172 through a series connection of an inductor L5 (1.40 nH in this example) and a capacitor C5 (149.76 pF). A shunt capacitor C6 (0.12 pF) connects input port 172 to circuit ground 56. Capacitor C5 is connected to conductor end 178$a$. A second end 178$b$ of signal conductor 178 is connected to a first end 180$a$ of signal conductor 180. A second end 180$b$ of signal conductor 180 is connected to a first end 182$a$ of signal conductor 182. A second end 182$b$ of signal conductor 182 is connected to a first end 184$a$ of signal conductor 184.

Conductor end 182$b$ is also connected to ground 56 by a series connection of an inductor L6 (0.50 nH) and a capacitor C7 (80.29 pF). Capacitor C7 adds capacitance to ground between signal conductors 182 and 184, and inductor L6 is included to model the inductive effects of the multi-layered conductors.

A second end 184$b$ of signal conductor 184 is connected to a first end 186$a$ of signal conductor 186. A second end 186$b$ of signal conductor 186 is connected to output port 174 via a series-connected inductor L7 (0.04 nH).

It is seen that transmission-line section 170 is separated serially along the chain of transmission-line sections from coupled transmission-line section 162 of coupler 175 by three intermediate transmission-line sections. As these are quarter-wavelength transmission-line sections in the preferred configuration, this means that the signals in coupled transmission-line sections 162, 170 are one full wavelength apart. This is in contrast to coupled transmission-line section pair 162, 166 of coupler 173 and transmission-line section pair 164, 168 of coupler 177, which are separated serially along the chain of transmission-line sections by one intermediate transmission-line section. In these latter cases, the respective signals in the two signal conductors forming each coupler are one-half wavelength apart.

Couplers 173, 177, 175 have respective characteristic impedances ZC1, ZC2, ZC3 that are between the input impedance ZIN and the output impedance ZOUT in value. For ZIN>ZOUT, the transmission-line section impedances are preferably selected so that ZIN>ZC1>ZC2>ZC3>ZOUT. As has been discussed, each quarter-wavelength coupler is configured to transform the impedance from the input impedance of the coupler to the output impedance of the coupler.

FIG. 12 also illustrates a couple of optional configurations of coupler 177. As is described above for impedance transformer 120 shown in FIGS. 9 and 10, one of the signal conductors in transmission-line sections 164 and 168 may be formed as signal conductor portions positioned on opposite sides of the other signal conductor. For example, signal conductor 168 may include a signal conductor portion 168-1, shown in solid lines and a signal conductor portion 168-2 shown in dashed lines. Signal conductor portions 168-1, 168-2 may be connected together by respective vias at opposite ends of the signal conductor portions.

Alternatively or additionally, transmission-line sections 164, 168 may be at least partially shielded from the electromagnetic fields of couplers 173, 175 by ground conductor portions 188, 190, both of which are shown in dashed lines on opposite sides of transmission-line sections 164, 166. Ground conductors 188, 190 preferably have the same profile as transmission-line sections 164, 168, when viewed normal to the plane of transmission-line section 164 or 168. Transmission-line section 164 is accordingly broadside coupled to ground conductor 188 and transmission-line section 168 is broadside coupled to ground conductor 190, as shown, with the broad traces providing increased capacitance to ground over the length of the transmission-line section. Ground conductors 188, 190 are connected to a ground plane providing circuit ground 56.

Figure 13:
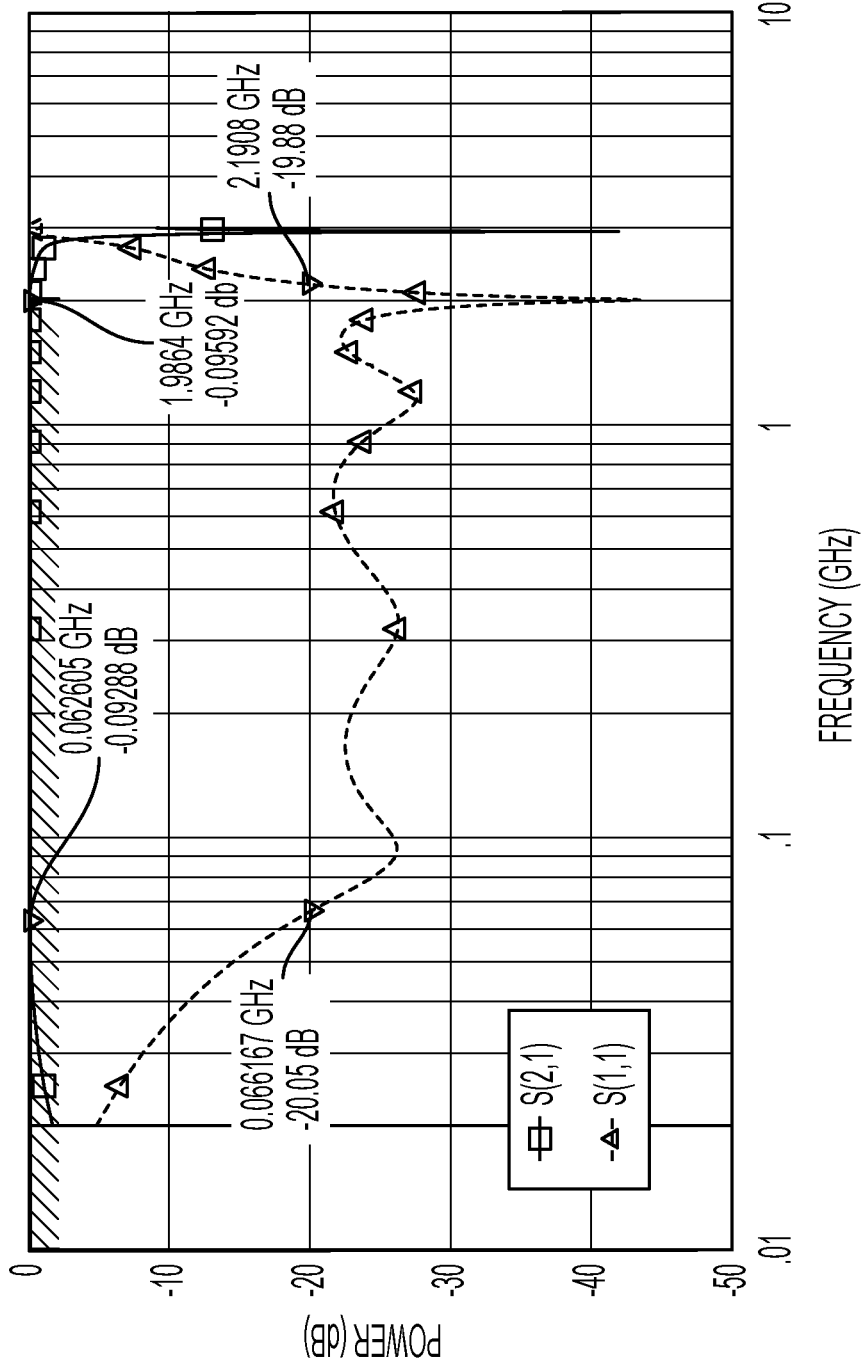
FIG. 13 is a chart showing the frequency response of the impedance transformer of FIG. 11.

FIG. 13 illustrates a frequency response of this example of transmission-line-based impedance transformer 160 over a frequency range of 0.06-2 GHz. It is seen that the return loss, S(1,1), for transmission-line-based impedance transformer 160 is below about −20 dB between 0.0662 GHz and 2.1908 GHz and insertion loss, S(2,1), is correspondingly very close to 0 dB over this bandwidth. Transmission-line-based impedance transformer 160 is thus seen to have a broader bandwidth than transmission-line-based impedance transformer 80.

Example 9

Figure 14:
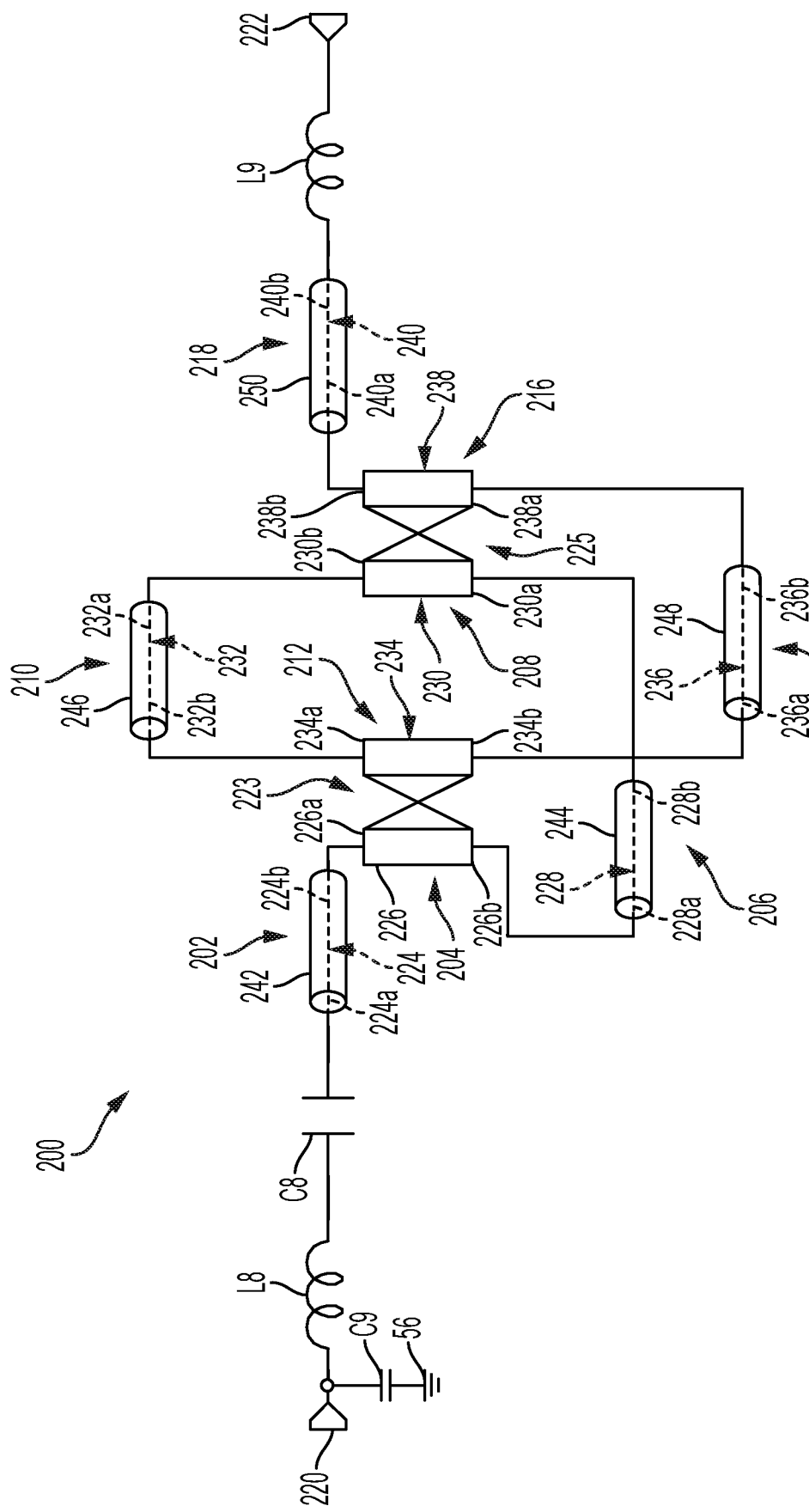
FIG. 14 is a simplified schematic diagram of an example of a nine-section transmission-line-based impedance transformer having two pairs of coupled sections.

A circuit schematic suitable for modeling a planar embodiment of a further example of a transmission-line-based impedance transformer 200 is shown in FIG. 14. In this example, transmission-line-based impedance transformer 200 has nine transmission-line sections 202, 204, 206, 208, 210, 212, 214, 216, 218 not connected in a spiral configuration. The nine transmission-line sections are connected in series between an input port 220 and an output port 222. These transmission-line sections each preferably have an electrical length equal to one-quarter of a wavelength ($\lambda/4$) (or an odd number of quarter wavelengths) of a center or design operating frequency of the circuit. Serially spaced-apart transmission-line sections 204, 212 are electromagnetically closely coupled, forming a first coupler 223. Also, serially spaced-apart transmission-line sections 208, 216 are also electromagnetically closely coupled, forming a second coupler 225.

Transmission-line sections 202, 204, 206, 208, 210, 212, 214, 216, 218 have respective signal conductors 224, 226, 228, 230, 232, 234, 236, 238, 240. Transmission-line sections 202, 206, 210, 214, 218 are coaxial transmission lines that are not closely coupled to another of the transmission-line sections. For these coaxial transmission lines, then, the signal conductors are the center conductors, which are shielded from the closely coupled transmission-line sections by respective outer or shield conductors connected to circuit ground. Specifically, coaxial transmission-line sections 202, 206, 210, 214, 218 have respective shield conductors 242, 244, 246, 248, 250.

A first end 224a of signal conductor 224 is connected to input port 220 through a series connection of an inductor L8 (0.50 nH in this example) and a capacitor C8 (14.84 pF). A shunt capacitor C9 (0.12 pF) connects input port 220 to circuit ground 56. Capacitor C8 is connected to conductor end 224a. A second end 224b of signal conductor 224 is connected to a first end 226a of signal conductor 226. A second end 226b of signal conductor 226 is connected to a first end 228a of signal conductor 228. A second end 228b of signal conductor 228 is connected to a first end 230a of signal conductor 230.

A second end 230b of signal conductor 230 is connected to a first end 232a of signal conductor 232. A second end 232b of signal conductor 232 is connected to a first end 234a of signal conductor 234. A second end 234b of signal conductor 234 is connected to a first end 236a of signal conductor 236. A second end 236b of signal conductor 236 is connected to a first end 238a of signal conductor 238. A second end 238b of signal conductor 238 is connected to a first end 240a of signal conductor 240. A second end 240b of signal conductor 240 is connected to output port 222 via a series-connected inductor L9 (0.005 nH).

It is seen that transmission-line sections 204 and 208 are each respectively separated serially along the chain of transmission-line sections by three intermediate transmission-line sections from the transmission-line sections 212 and 216 to which they are respectively closely coupled. As these are quarter-wavelength transmission-line sections in the preferred configuration, the signals in each pair of coupled transmission-line sections are one full wavelength apart.

Transmission-line sections 202, 206, 210, 214, 218, and couplers 223, 225 have respective characteristic impedances Z1, Z2, Z3, Z4, Z5, ZC1, ZC2, that are between the input impedance ZIN and the output impedance ZOUT in value. For ZIN>ZOUT, the transmission-line section impedances are preferably selected so that the impedance is generally progressively transformed from ZIN to ZOUT. As one example, for a center design frequency of 638 MHz, ZIN=50 ohms, and ZOUT=25 ohms, then the transmission-line section impedances may be Z1=47.8 ohms, ZC1=47.86 ohms, Z2=42.75 ohms, ZC2=47.31 ohms, Z3=38 ohms, Z4=27.6 ohms, and Z5=29.1 ohms. It will be noted that the impedances do not progress consistently in direction of change in value (positive or negative) between ZIN and ZOUT. However, all of the characteristic impedances are between ZIN and ZOUT in value. It has been found through simulations that some variations to a consistent general trend, i.e., a reverse change between adjacent transmission-line section impedances, improves bandwidth of the impedance transformer.

Additional Examples

This section describes additional aspects and features of passive impedance transformers, presented without limitation as a series of paragraphs that are alphanumerically designated for clarity and efficiency. Each of these paragraphs can be combined with one or more other paragraphs, and/or with disclosure from elsewhere in this application in any suitable manner. Some of the paragraphs below expressly refer to and further limit other paragraphs, providing without limitation examples of some of the suitable combinations.

A1. An impedance transformer comprising a first coupler including first and second transmission lines, wherein the first transmission line includes a first signal conductor and the second transmission line includes a second signal conductor, the first and second transmission lines each having a respective physical length corresponding to an odd-numbered multiple of a quarter of a wavelength of a design frequency, the first and second signal conductors are electromagnetically closely coupled; and a second coupler including third and fourth transmission lines, wherein the third transmission line includes a third signal conductor and the second transmission line includes a fourth signal conductor, the third and fourth transmission lines each having a respective physical length corresponding to an odd-numbered multiple of the quarter of the wavelength of the design frequency, the third and fourth signal conductors are electromagnetically closely coupled; and wherein the first, second, third, and fourth signal conductors are connected sequentially in series between an input port configured to be connected to a first external circuit having an input impedance and an output port configured to be connected to a second external circuit having the output impedance, the third signal conductor is connected in series between the first signal conductor and the second signal conductor, the first coupler has a first characteristic impedance between the input impedance and the output impedance, and the second coupler has a second characteristic impedance between the first characteristic impedance and the output impedance.

A2. The impedance transformer of paragraph A1, wherein the fourth signal conductor is connected in series between the second signal conductor and the output port.

A3. The impedance transformer of paragraph A2, wherein the first, second, third and fourth signal conductors are disposed in at least two parallel planes in a spiral with the first and second signal conductors in at least partial alignment when viewed normal to a plane of the first signal conductor and the third and fourth signal conductors in at least partial alignment when viewed normal to a plane of the third signal conductor.

A4. The impedance transformer of paragraph A3, wherein the first signal conductor includes first and second conductor portions disposed in respective spaced-apart parallel planes, and the second signal conductor is disposed physically directly between the first and second conductor portions.

A5. The impedance transformer of paragraph A4, wherein the first conductor portion has opposite ends connected to corresponding opposite ends of the second conductor portion.

A6. The impedance transformer of paragraph A3, further comprising fifth and sixth conductors each connected to a circuit ground and disposed in respective spaced-apart parallel planes, wherein the third and fourth signal conductors extend between the fifth and sixth conductors with the third and fourth signal conductors, and the fifth and sixth conductors in at least partial alignment when viewed normal to the plane of the third signal conductor.

A7. The impedance transformer of paragraph A3, further comprising a lumped shunt capacitor connected between circuit ground and a junction between two serially adjacent signal conductors of the first, second, third and fourth signal conductors.

A8. The impedance transformer of paragraph A7, wherein the shunt capacitor is connected between circuit ground and either a junction between the first and third signal conductors or a junction between the second and fourth signal conductors.

A9. The impedance transformer of paragraph A7, wherein the junction the shunt capacitor is connected to is spaced from a position on the spiral that is halfway along the signal conductors forming the spiral between ends of the spiral.

A10. The impedance transformer of paragraph A2, further comprising at least a fifth conductor connected to a circuit ground, wherein the fifth conductor extends along and is closely coupled to the third signal conductor.

A11. The impedance transformer of paragraph A10, further comprising a sixth conductor also connected to the circuit ground, wherein the sixth conductor extends along and is closely coupled to the fourth signal conductor, the fifth and sixth conductors are disposed in respective spaced-apart parallel planes, and the third and fourth signal conductors extend between the fifth and sixth conductors with the third and fourth signal conductors and the fifth and sixth conductors in at least partial alignment when viewed normal to the plane of the third signal conductor.

A12. The impedance transformer of paragraph A1, further comprising a fifth transmission line having a physical length corresponding to an odd-numbered multiple of the quarter of the wavelength of the design frequency, wherein the fifth transmission line includes a fifth signal conductor connected electrically in series with the first, second, third, and fourth transmission lines between the input port and the output port, has a third characteristic impedance between the input impedance and the first characteristic impedance, and the fifth signal conductor is electrically connected between the input port and the first signal conductor.

A13. The impedance transformer of paragraph A1, further comprising a fifth transmission line having a physical length corresponding to an odd-numbered multiple of the quarter of the wavelength of the design frequency, wherein the fifth transmission line includes a fifth signal conductor connected electrically in series with the first, second, third, and fourth transmission lines between the input port and the output port, has a third characteristic impedance between the first characteristic impedance and the second characteristic impedance, and the fifth signal conductor is electrically connected between the first signal conductor and the third signal conductor.

A14. The impedance transformer of paragraph A1, further comprising a fifth transmission line having a physical length corresponding to an odd-numbered multiple of the quarter of the wavelength of the design frequency, wherein the fifth transmission line includes a fifth signal conductor connected electrically in series with the first, second, third, and fourth transmission lines between the input port and the output port, has a third characteristic impedance between the first characteristic impedance and the second characteristic impedance, and the fifth signal conductor is electrically connected between the second signal conductor and the third signal conductor.

A15. The impedance transformer of paragraph A1, further comprising a fifth transmission line having a physical length corresponding to an odd-numbered multiple of the quarter of the wavelength of the design frequency, wherein the fifth transmission line includes a fifth signal conductor connected electrically in series with the first, second, third, and fourth transmission lines between the input port and the output port, and the fifth signal conductor is electromagnetically closely coupled to one of the first and second signal conductors and forms with the one of the first and second signal conductors a third coupler having a third characteristic impedance between the input impedance and the output impedance.

A16. The impedance transformer of paragraph A1, further comprising a lumped shunt capacitor connected between circuit ground and a junction between two serially adjacent signal conductors of the first, second, third and fourth signal conductors.

A17. The impedance transformer of paragraph A1, further comprising a lumped series capacitor connecting the input port to the first signal conductor.

B1. An impedance transformer comprising a first coupler including first and second transmission lines, wherein the first transmission line includes a first signal conductor and the second transmission line includes a second signal conductor, the first and second transmission lines each having a respective physical length corresponding to an odd-numbered multiple of a quarter of a wavelength of a design frequency, the first and second signal conductors are connected sequentially in series between an input port configured to be connected to a first external circuit having an input impedance and an output port configured to be connected to a second external circuit having the output impedance, the first coupler has a first characteristic impedance between the input impedance and the output impedance, the second signal conductor includes first and second conductor portions, and the first signal conductor is disposed physically between and is electromagnetically closely coupled to the first and second conductor portions.

B2. The impedance transformer of paragraph B1, wherein the first coupler is a coaxial transmission line, the first signal conductor is a center conductor of the coaxial transmission line, and the second signal conductor is a shield conductor of the coaxial transmission line with the first and second conductor portions being opposite portions of the shield conductor.

B3. The impedance transformer of paragraph B1, wherein the first signal conductor and the first and second conductor portions are disposed in at least respective spaced-apart parallel planes and are in at least partial alignment when viewed normal to the plane of the first signal conductor.

B4. The impedance transformer of paragraph B1, further comprising a lumped series capacitor connecting the input port to the first signal conductor.

C1. An impedance transformer comprising a plurality of transmission lines including first, second, and third transmission lines, with each transmission line having an electrical length corresponding to an odd-numbered multiple of a quarter of a wavelength of a design frequency, wherein the plurality of transmission lines are connected to each other electrically in series between an input port of a first external circuit having an input impedance at the input port and an output port of a second external circuit having the output impedance at the output port, each of the plurality of transmission lines has a respective signal conductor, and a first signal conductor of the first transmission line and a second signal conductor of the second transmission line are electromagnetically closely coupled and form a first coupler having a first characteristic impedance between the input impedance and the output impedance, and the second signal conductor and a third signal conductor of the third transmission line are electromagnetically closely coupled and form a second coupler having a second characteristic impedance between the input impedance and the output impedance.

C2. The impedance transformer of paragraph C1, further comprising fourth and fifth transmission lines, wherein the fourth transmission line includes a fourth signal conductor and the fifth transmission line includes a fifth signal conductor, the fourth and fifth transmission lines each having a respective physical length corresponding to an odd-numbered multiple of the quarter of the wavelength of the design frequency, the fourth and fifth signal conductors are electromagnetically closely coupled and form a third coupler having a third characteristic impedance between the input impedance and the output impedance.

C3. The impedance transformer of paragraph C2 further comprising a sixth conductor connected to a circuit ground and extending along and electromagnetically closely coupled to the fourth signal conductor opposite from the fifth signal conductor.

C4. The impedance transformer of paragraph C3, further comprising a seventh conductor also connected to the circuit ground, wherein the seventh conductor extends along and is electromagnetically closely coupled to the fifth signal conductor, and the fifth signal conductor extends physically between the fourth signal conductor and the seventh conductor.

C5. The impedance transformer of paragraph C2, wherein the fourth signal conductor includes first and second conductor portions and the fifth signal conductor is disposed physically between and is electromagnetically closely coupled to the first and second conductor portions.

C6. The impedance transformer of paragraph C2, wherein the fourth signal conductor is connected electrically in series between the first and second signal conductors.

C7. The impedance transformer of paragraph C6, wherein the fifth signal conductor is connected electrically in series between the second and third signal conductors.

C8. The impedance transformer of paragraph C2, wherein one signal conductor of the first, second, and third signal conductors is connected electrically in series between the fourth and fifth signal conductors.

C9. The impedance transformer of paragraph C8, wherein the fourth signal conductor is connected electrically in series between the one signal conductor and another signal conductor of the first, second, and third signal conductors.

C10. The impedance transformer of paragraph C9, wherein the fifth signal conductor is connected electrically in series between the one signal conductor and the remaining signal conductor of the first, second, and third signal conductors.

C11. The impedance transformer of paragraph C2, further comprising a lumped shunt capacitor connected between circuit ground and a junction between two serially adjacent signal conductors of the first, second, third, fourth, and fifth signal conductors.

C12. The impedance transformer of paragraph C1, further comprising a lumped series capacitor connecting the input port to the first signal conductor.

Advantages, Features, Benefits

The different embodiments of the transmission-line-based impedance transformers described herein provide several advantages over known solutions for transforming impedance between an input circuit and an output circuit. For example, the illustrative embodiments of transmission-line-based impedance transformers described herein provide effective impedance transformation over a broad bandwidth. Thus, the illustrative embodiments described herein are particularly useful for broad spectrum communication channels. However, not all embodiments described herein provide the same advantages or the same degree of advantage.

Conclusion

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

What is claimed is:

1. An impedance transformer comprising a plurality of transmission lines including first, second, and third transmission lines, with each transmission line having an electrical length corresponding to an odd-numbered multiple of a quarter of a wavelength of a design frequency, wherein the plurality of transmission lines have respective signal conductors connected directly to each other electrically in series between an input port of a first external circuit having an input impedance at the input port and an output port of a second external circuit having the output impedance at the output port, a first signal conductor of the first transmission line and a second signal conductor of the second transmission line are electromagnetically closely coupled and form a first coupler having a first characteristic impedance having an impedance value between impedance values of the input impedance and the output impedance, and the second signal conductor and a third signal conductor of the third transmission line are electromagnetically closely coupled and form a second coupler having a second characteristic impedance having an impedance value between the impedance values of the input impedance and the output impedance.

2. The impedance transformer of claim 1, wherein the plurality of transmission lines includes fourth and fifth transmission lines, the fourth transmission line includes a fourth signal conductor and the fifth transmission line includes a fifth signal conductor, the fourth and fifth transmission lines each having a respective physical length corresponding to an odd-numbered multiple of the quarter of the wavelength of the design frequency, the fourth and fifth signal conductors are electromagnetically closely coupled and form a third coupler having a third characteristic impedance having an impedance value between the impedance values of the input impedance and the output impedance.

3. The impedance transformer of claim 2, wherein one signal conductor of the first, second, and third signal conductors is connected electrically in series between the fourth and fifth signal conductors.

4. The impedance transformer of claim 3, wherein the fourth signal conductor is connected electrically in series between the one signal conductor and another signal conductor of the first, second, and third signal conductors.

5. The impedance transformer of claim 4, wherein the fifth signal conductor is connected electrically in series between the one signal conductor and the remaining signal conductor of the first, second, and third signal conductors.

6. The impedance transformer of claim 2 further comprising a sixth conductor connected to a circuit ground and extending along and electromagnetically closely coupled to the fourth signal conductor opposite from the fifth signal conductor.

7. The impedance transformer of claim 6, further comprising a seventh conductor also connected to the circuit ground, wherein the seventh conductor extends along and is electromagnetically closely coupled to the fifth signal conductor, and the fifth signal conductor extends physically between the fourth signal conductor and the seventh conductor.

8. The impedance transformer of claim 2, wherein the fourth signal conductor is connected electrically in series between the first and second signal conductors.

9. The impedance transformer of claim 8, wherein the fifth signal conductor is connected electrically in series between the second and third signal conductors.

10. The impedance transformer of claim 2, wherein the fourth signal conductor includes first and second conductor portions having respective ends that are directly connected together and the fifth signal conductor is disposed physically between and is electromagnetically closely coupled to the first and second conductor portions.

11. The impedance transformer of claim 2, further comprising a lumped shunt capacitor connected between circuit ground and a junction between two serially adjacent signal conductors of the first, second, third, fourth, and fifth signal conductors.

12. The impedance transformer of claim 1, further comprising a lumped series capacitor connecting the input port to the first signal conductor.

* * * * *